United States Patent [19]
Uya

[11] Patent Number: 4,498,021
[45] Date of Patent: Feb. 5, 1985

[54] BOOSTER FOR TRANSMITTING DIGITAL SIGNAL
[75] Inventor: Masaru Uya, Kadoma, Japan
[73] Assignee: Matsushita Electric Industrial Co., Ltd., Kadoma, Japan
[21] Appl. No.: 397,871
[22] Filed: Jul. 13, 1982
[51] Int. Cl.³ .......................... H03K 5/12; H03K 6/04
[52] U.S. Cl. .................................. 307/443; 307/263; 307/268; 307/270; 307/360
[58] Field of Search .................... 307/200 B, 443, 448, 307/482, 354, 360, 363, 268, 270, 592, 593, 594, 597, 263; 328/164

[56] References Cited
U.S. PATENT DOCUMENTS
3,947,776  3/1976  Stevens et al. ...................... 307/360
4,384,216  5/1983  Pricer ................................... 307/263
4,390,797  6/1983  Ishimoto ............................. 307/482
4,398,100  8/1983  Tobita et al. ....................... 307/482
4,421,994 12/1983  Puri et al. ........................... 307/270

Primary Examiner—John Zazworsky
Attorney, Agent, or Firm—Cushman, Darby & Cushman

[57] ABSTRACT

For voltage on a digital signal line whose load capacitance is comparatively large as in a bus line of a CMOS integrated circuit, a detection is made that said voltages enter into a specified voltage range between the ground voltage and the power supply voltage, then based on such detection the voltage on said signal line is raised up or pulled down rapidly by a current injection means or a current ejection means, respectively, thereby the signal propagation delay is reduced.

9 Claims, 8 Drawing Figures

BOOSTER FOR TRANSMITTING DIGITAL SIGNAL

BACKGROUND OF THE INVENTION

1. Field of the Invention

The present invention relates to a booster circuit for digital signal transmissions, which is used by attaching it to a signal line for transmitting digital voltage signals such as in a bus line in a computer, and thereby the signal transmission speed is raised up through reducing the signal propagation delay due to load capacitance and/or load resistance of the signal line. The booster has an extremely large effect particularly when it is applied to signal lines in integrated circuits.

2. Description of the Prior Art

In a signal line in a MOS integrated circuit such as a bus line of a microcomputer, because of its comparatively large amount of parasitic capacitance and gate input capacitance and also because of a relatively high impedance of a MOS transistor used for driving the signal line, the delay of the signal propagation becomes considerably large.

FIG. 1 is a curve showing a variation of voltage on a signal line in a CMOS (complementary-MOS) integrated circuit. When any one of gates for driving the signal line makes a transition from low level to high level at a time $t_1$, a signal appears on an input of a receiving gate with a variation of a charging curve determined mainly by a load capacitance of the signal line and an output impedance of the driving gate as shown by a broken curve in FIG. 1. The threshold voltage $V_{TH}$ of input and output signals is ordinarily taken to be a half value of a power supply voltage $V_{DD}$. This means that the receiving gate receives a signal of "0" to "1" at a time $t_B$ at which the broken curve crosses $V_{TH}$. Therefore, the propagation delay time on the signal line becomes the large time interval of $t_B-t_1$ in FIG. 1. Although this signal propagation delay time may be reduced by making line driving transistors large, in the case such as in a bus line of a microcomputer wherein a large number of input and output gates (for example, input and output gates of various registers) are connected, the enlargement of transistors of individual output gates requires extremely large area and therefore an increase in the chip size and hence an increase in the power consumption is brought about. This is an unfavorable result.

SUMMARY OF THE INVENTION

The present invention has been made to improve the signal propagation speed on a signal line for transmitting digital voltage signals such as in a bus line, by reducing the propagation delay caused by a load capacitance of the signal line. Particularly, the present invention purports to offer an auxiliary circuit for use in the digital signal transmission which can present a remarkable effect when it is applied to signal lines in a digital integrated circuit.

Furthermore, the present invention purports to realize the raising up of the signal propagation speed without introducing any excessive increase in chip size or power consumption of integrated circuits.

DESCRIPTION OF THE PREFERRED EMBODIMENT

Figure 1:
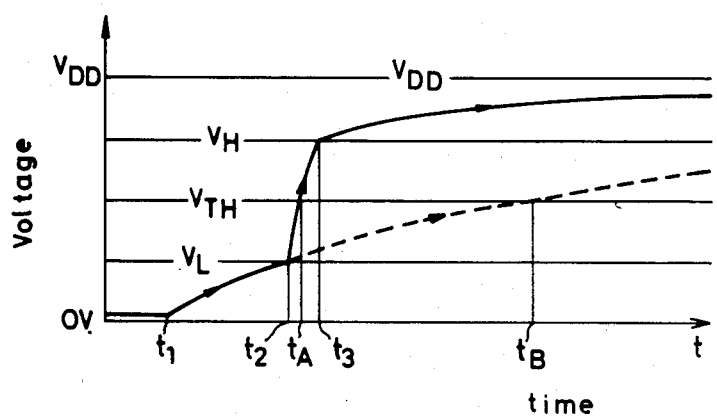
FIG. 1 shows voltage variations on a signal line in a CMOS integrated circuit.

In FIG. 1, if a circuit has a function that the voltage of the signal line is rapidly raised up only when the voltage comes in a range between $V_L$ and $V_H$, after a point of time $t_2$ at which the voltage crosses $V_L$, the voltage varies as shown by a solid curve. Then, thereby the propagation delay on the signal line is cut down to $t_A-t_1$ from $t_B-t_1$, that is, a time-reduction as much as $t_B-t_A$ is gained. Hereupon, if the capacitance of the signal line is taken to be C and the output resistance of the drive gate to be R, and if the above capacitance C is charged from a power supply of a voltage $V_{DD}$ with an equivalent resistance r while the voltage is between $V_L$ and $V_H$, the voltage variation takes a charging curve having a time constant of CR for time periods from $t_1$ to $t_2$ and after $t_3$, and it takes another charging curve having another time constant $$C \cdot 1/\left(\frac{1}{R} + \frac{1}{r}\right)$$

for a time period between $t_2$ and $t_3$. For obtaining the rapid rise of the line voltage while it is between $V_L$ and $V_H$, any element which can charge up rapidly the above capacitance C can be used. In the following embodiment of the present invention, as shown in FIG. 2, a p-channel MOS transistor 7 supplies current to charge up the capacitance C.

In FIG. 1, only the case where the voltage on the signal line makes the transition from "0" to "1" is shown, however, also in the case where the reverse transition from "1" to "0", similarly as in the above case, by discharging the capacitance C for the voltage range from $V_H$ to $V_L$ (not necessarily the same value with $V_H$ and $V_L$ in the case of "0" to "1") wherein a voltage $V_{TH}$ is included, the voltage falls down rapidly. Thus the propagation delay for the transition from "1" to "0" is also reduced largely.

Figure 2:
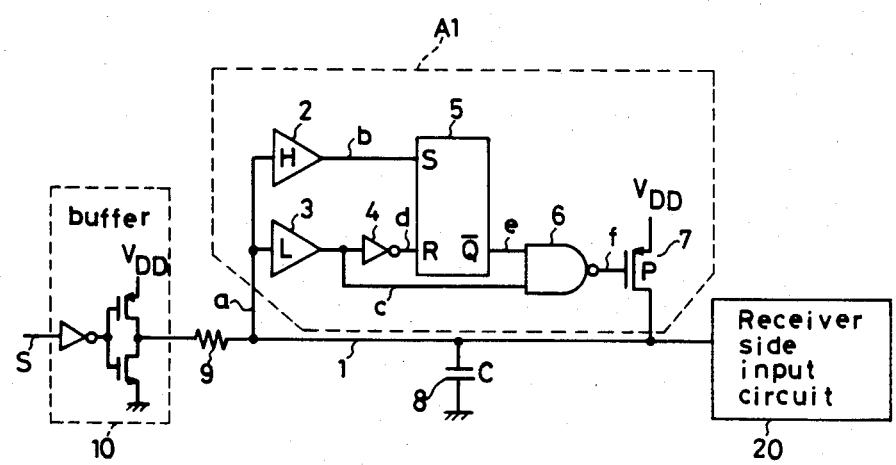
FIG. 2 is a circuit diagram of a signal transmission circuit of an embodiment in accordance with the present invention.

In FIG. 2, an embodiment of the present invention is shown.

Numeral 1 designates a long signal line having a relatively large load capacitance. Numeral 8 designates a capacitance C which represents the above-mentioned load capacitance of the line as a lumped circuit element. Numeral 10 designates a buffer of an output circuit of a transmitter side launching the signal onto the signal line 1, and numeral 20 designates an input circuit of a receiver side for receiving the signals appearing on the signal line 1. Numeral 9 designates a resistance representing equivalently an output resistance of the buffer 10. A section $A_1$ surrounded by a broken line shows an embodiment of the digital signal transmission booster circuit of the present invention. Numeral 2 designates a $V_H$-detection circuit for detecting whether the voltage on the signal line 1 exceeds $V_H$ or not, it issues "0" when the voltage $V_a$ on the signal line 1 is $0 < V_a < V_H$, and it issues "1" when $V_a$ is $V_H \leq V_a < V_{DD}$. Numeral 3 designates a $V_L$-detection circuit for detecting whether the voltage on the signal line 1 exceeds $V_L$ or not, it issues "0" when the voltage $V_a$ on the signal line 1 is $0 < V_a < V_L$, and it issues "1" when $V_a$ is $V_L \leq V_a < V_{DD}$. Hereupon $V_L$ is taken as $V_L < V_H$. Numerals 4, 5 and 6 designate an inverter, an RS flip-flop, and a NAND gate, respectively. Numeral 7 designates a p-channel enhancement type MOS transistor which is used as a current injection means, and its drain is connected to the signal line 1.

Figure 3:
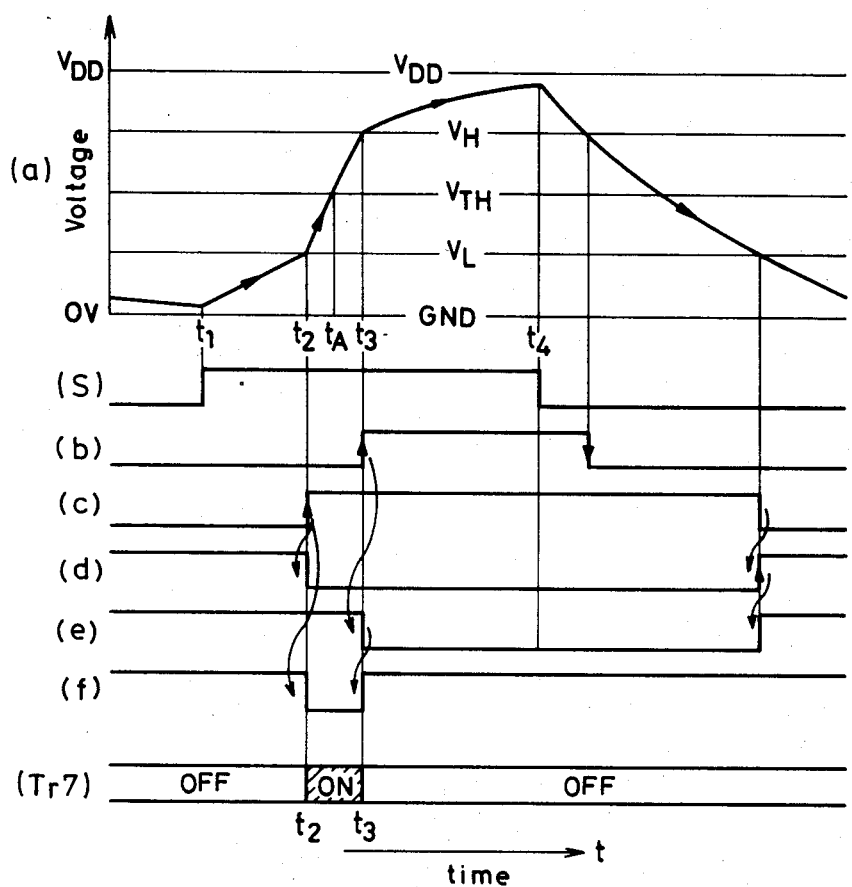
FIG. 3 shows signal waveforms at various parts of the circuit of FIG. 2.

Next, the operation of the embodiment shown in FIG. 2 is explained briefly. In FIG. 3, for various points S, a, b, c, d, e and f in FIG. 2, voltage waveforms at those points, (S), (a), (b), (c), (d), (e) and (f) and the ON-OFF states of this p-channel transistor are shown. These waveforms are those corresponding to the case that the input S to the buffer 10 changes from "0" to "1" at a time $t_1$ and changes from "1" to "0" at a time $t_4$. It can be seen that only during a time period from $t_2$ to $t_3$, both of which are time points on the way of the transistion of "0" to "1", the p-channel transistor 7 is being kept ON. In the timing chart of FIG. 3, in order to appreciate small differences, the time scale of the abscissa $t_2$ and $t_3$ is drawn longer than those of other parts. The signal propagation delay on the signal line is thus reduced to $t_4-t_1$ for the case of "0" to "1".

Thus, with these $V_H$ and $V_L$ detection circuits, inverter, RS flip-flop, and NAND gate, a p-channel MOS transistor 7 is made conductive, thereby the load capacitance can be charged rapidly and hence the propagation delay of the signal is cut down largely. Hereupon, the action of the transmission booster circuit $A_1$ is performed in a very short time of about 2 to 3 nsec, then in the case where the output resistance of the buffer 10 is for example 20 to 30 kΩ, if the ON-resistance of the transistor 7 can be made as low as 2 to 3 kΩ, addition of $A_1$ shown in FIG. 2 to the signal line can reduce the signal propagation delay to less than a half.

Figure 4:
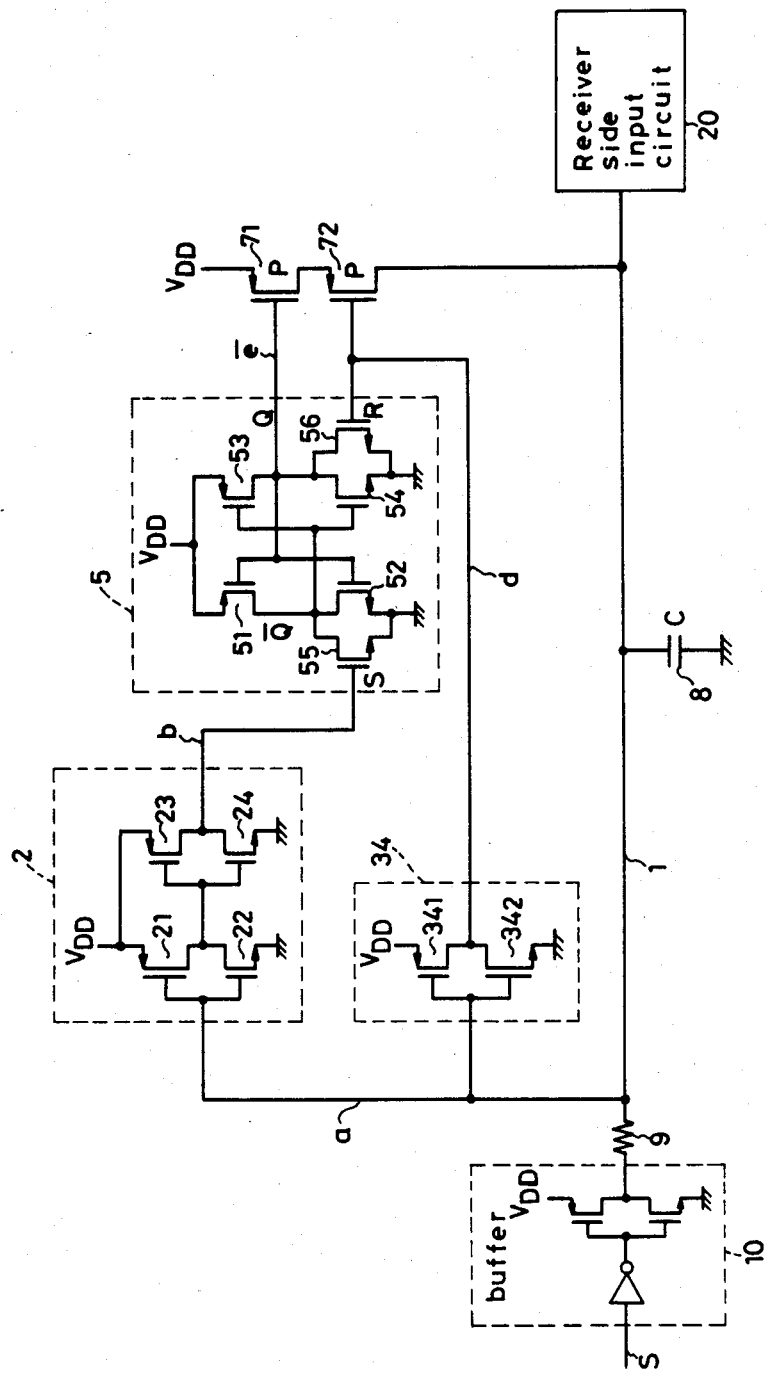
FIG. 4 is a detailed practical circuit diagram of the circuit shown in FIG. 2.

Next, an example of a detailed circuit diagram which is a practical realization of the embodiment of FIG. 2 is shown in FIG. 4.

In FIG. 4, numerals 1, 8, 9 and 10 represent those elements having the same functions as the elements having the same numerals in FIG. 2. Numerals 2 and 5 designate a $V_H$-detection circuit and an RS flip-flop, respectively, and they have the same functions as numerals 2 and 5 of FIG. 2 have. Numeral 34 designates a $V_L$-detection circuit which has the same function as numerals 3 and 4 of FIG. 2 have. Numerals 71 and 72 designate a p-channel enhancement type MOS transistors having the same function as the transistor 7 of FIG. 2, that is, it works as a current injection means to the signal line. Numerals 21, 23, 51, 53 and 341 designate p-channel transistors, while numerals 22, 24, 52, 54, 55, 56 and 342 are n-channel transistors. In an inverter comprising the p-channel transistor 21 and the n-channel transistor 22 in the $V_H$-detection circuit 2, by making the transconductance $g_{mp}$ of the transistor 21 larger than the transconductance $g_{mn}$ of the transistor 22, the threshold voltage of the inverter is set to a value $V_H$ which is larger than $V_{DD}/2$ (for example, in case of $V_{DD}=5$ V, $V_H=3.5$ V). Similarly in the $V_L$-detection circuit 34, by making the transconductance $g_{mn}$ of the n-channel transistor 342 larger than the transconductance $g_{mp}$ of the p-channel transistor 341, the threshold voltage of the inverter is set to a value $V_L$ which is less than $V_{DD}/2$ (for example, in case of $V_{DD}=5$ V, $V_L=1.5$ V). Numeral 5 forms an RS flip-flop with the well-known CMOS structure.

The detailed circuit diagram of the practical embodiment shown in FIG. 4 has the same function as the embodiment shown in FIG. 2, and signals a, b and d at the various parts in FIG. 4 are the same with those signals having the same notation in FIG. 2. Signal $\bar{e}$ in FIG. 4 is an inverted signal of a signal e in FIG. 2. In the circuit diagram of FIG. 4, in order to make the response speed fast, the function of the NAND-gate 6 in FIG. 2 is realized by a series connection of two p-channel transistors 71 and 72. That is, in the embodiment example of FIG. 2, only when e=c="1", namely, only when $\bar{e}=d=$"0", the p-channel transistor 7 is turned on and the current is injected into the signal line 1, and corresponding to the above, in the practical circuit diagram of FIG. 4, only when $\bar{e}=d=$"0", both of those p-channel transistors 71 and 72 are turned on, therefore their actions are the same and hence the voltage waveforms at various parts become the same with those in FIG. 3. In the case of the practical embodiment of FIG. 4, at the time $t_2$ of FIG. 3, the $V_L$-detection circuit 34 is inverted, then by this output the p-channel transistor 72 turns from OFF to ON, and since the p-channel transistor 71 is already in the ON-state at this time, the current is injected immediately to the signal line 1. In this embodiment of FIG. 4, a faster operation in comparison with the embodiment of FIG. 2 is gained because the FIG. 4 circuit dispences with one NAND gate (6 of FIG. 2) as the previous stage to the output p-channel FET 7.

Figure 5:
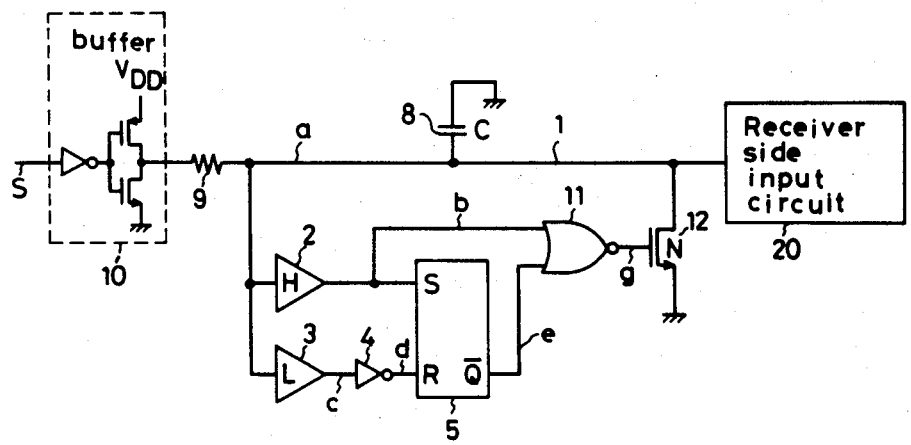
FIG. 5 is a circuit diagram of a signal transmission circuit of another embodiment in accordance with the present invention.

Another embodiment of the present invention is shown in FIG. 5. In contrast with the effect of the signal propagation speed-up for the case of "0" to "1", the present embodiment shown in FIG. 5 has the effect of signal propagation speed-up for the case of "1" to "0".

In FIG. 5, numerals 1 to 5 and 8 to 10 are the same elements as those having the same numerals in FIG. 2, and their functions are the same. Numeral 11 is a NOR gate which issues a NOR signal between the output signal b of the $V_H$ detection circuit 2 and the $\bar{Q}$-output e of the RS flip-flop, and numeral 12 is a current ejection means, that is, it is an n-channel enhancement type MOS transistor whose gate input signal is the output g of the NOR gate 11 and whose drain is connected to the signal line 1, thereby the current on the signal line is ejected very rapidly.

Figure 6:
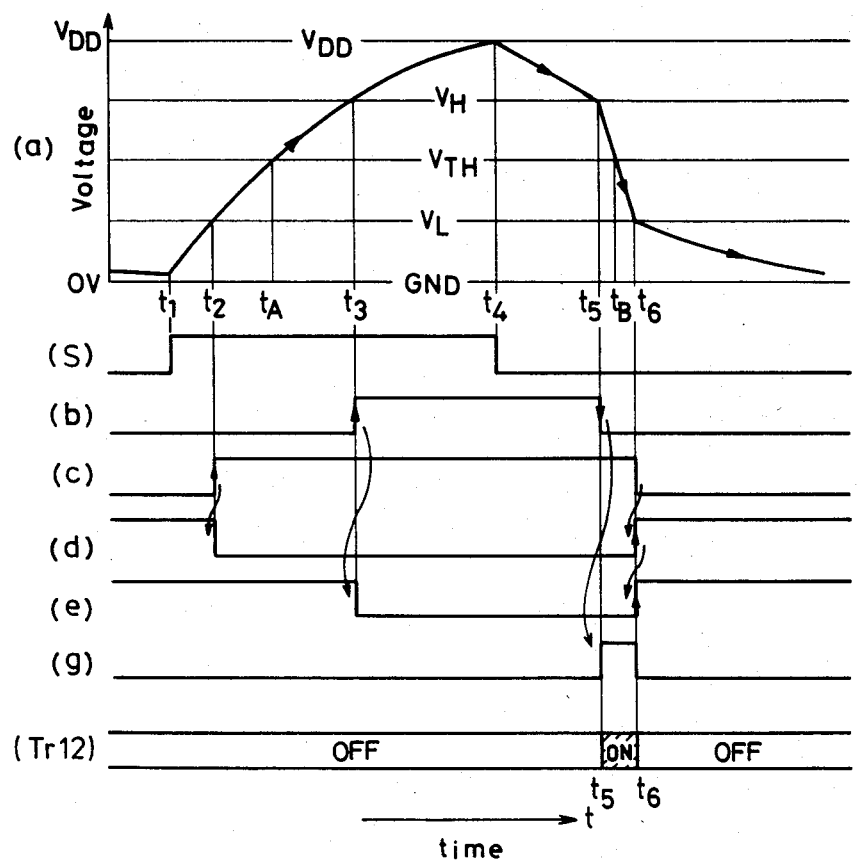
FIG. 6 shows signal waveforms at various parts of the circuit of FIG. 5.

In FIG. 6, voltage waveforms (S), (a) to (e), and (g) at various parts S, a to e, and g in FIG. 5, and the ON-OFF states of the n-channel transistor 12 are shown. Waveforms shown in FIG. 6 are those corresponding to the case that, likewise in FIG. 3, the input S of the buffer 10 turns from "0" to "1" at a time $t_1$ and turns back from "1" to "0" at a time $t_4$. It is understood that only in a time interval from $t_5$ to $t_6$ the n-channel transistor 12 turns on, thereby the voltage a of the signal line 1 is lowered rapidly. The signal propagation delay is thus cut down to $t_B-t_4$.

Figure 7:
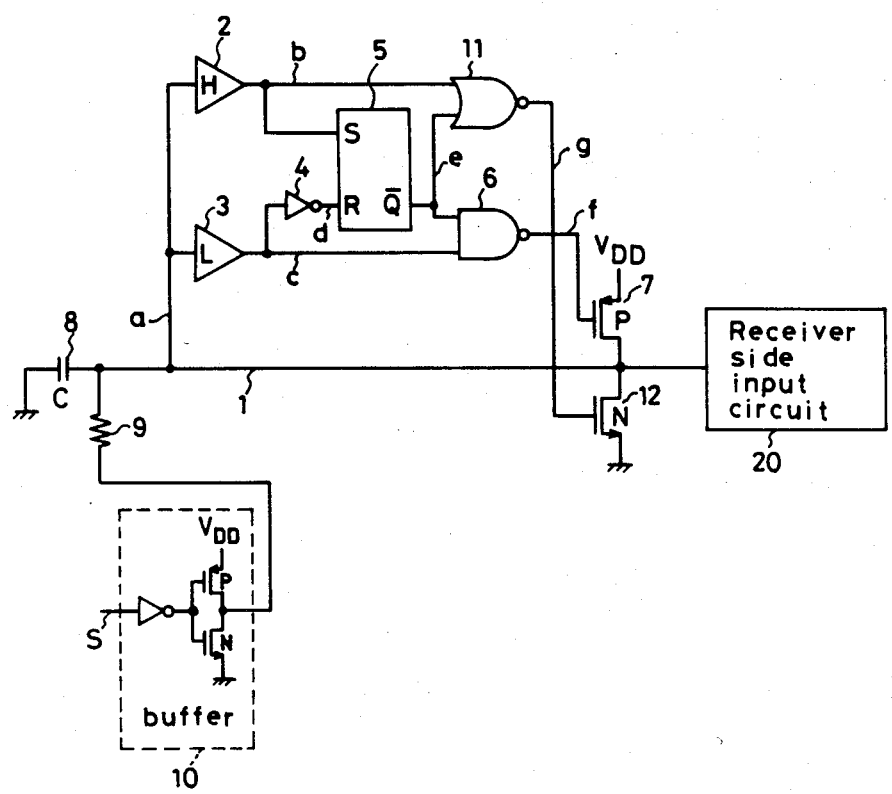
FIG. 7 is a circuit diagram of a signal transmission circuit of still another embodiment in accordance with the present invention.

In FIG. 7, still another embodiment of the present invention is shown.

Numeral 1 is a long signal line having a relatively large load capacitance. Numeral 8 is a capacitance C which represents the above-mentioned load capacitance of the line as a lumped circuit element. Numeral 10 is a buffer of an output circuit of a transmitter side launching the signal onto the signal line 1. Numeral 9 is a resistance representing equivalently an output resistance of the buffer 10. Numeral 2 is a $V_H$-detection circuit detecting whether the voltage on the signal line 1 exceeds $V_H$ or not, it issues "0" when the voltage $V_a$ on the signal line 1 is $0<V_a<V_H$, and it issues "1" when $V_a$ is $V_H \leq V_a < V_{DD}$. Numeral 3 is, similarly as numeral 2, a $V_L$-detection circuit detecting whether the voltage on the signal line 1 exceeds $V_L$ or not, it issues "0" when the voltage $V_a$ on the signal line 1 is $0<-V_a<V_L$, and it issues "1" when $V_a$ is $V_L \leq V_a < V_{DD}$. Hereupon $V_L$ is taken as $V_L<V_H$. Numerals 4, 5, 11 and 6 represent an inverter, an RS flip-flop, a NOR gate, and NAND gate, respectively. Numerals 7 and 12 are a p-channel MOS transistor and an n-channel MOS transistor whose drains are connected to the signal line.

Next, the operation of the embodiment shown in FIG. 7 is explained.

Figure 8:
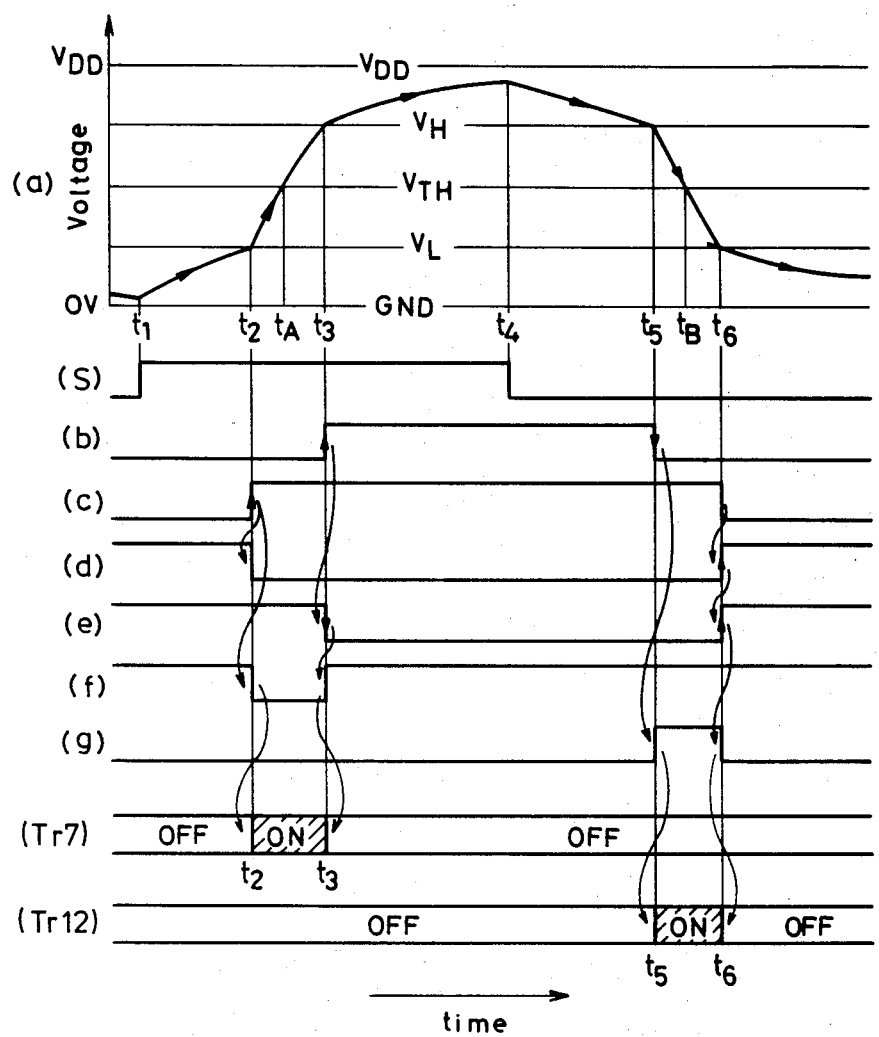
FIG. 8 shows signal waveforms at various parts of the circuit of FIG. 7.

In FIG. 8, voltage waveforms (S) and (a) to (g) at various parts, S and a to g in FIG. 7, and the ON-OFF states of the p- and n-channel transistors 7 and 12 are shown. Waveforms shown in FIG. 8 are those corresponding to the case that the input S of the buffer 10 turns from "0" to "1" at a time $t_1$ and turns back from "1" to "0" at a time $t_4$. It is understood that only in a time interval from $t_2$ to $t_3$, which are the times on the way of the transition, the output of the gate 6 turns to the low level and hence p-channel transistor 7 turns on, meanwhile only in a time interval from $t_5$ to $t_6$, which are the times on the way of the transition, the output of the gate 11 turns to the high level and hence the n-channel transistor 12 turns on. In the timing chart of FIG. 8, in order to appreciate small differences, the time scales of the abscissa between $t_2$ and $t_3$, and $t_5$ and $t_6$ are drawn longer than those of other parts. The signal propagation delays on the signal line in this embodiment become $t_A-t_1$ for the transition of "0" to "1" and $t_B-t_4$ for that of "1" to "0".

As has been described above, by the $V_H$- and $V_L$-detection circuits, the inverter, the RS flip-flop, and two NAND gates, the p-channel and the n-channel transistors are turned to the conductive state, thereby the load capacitance of the signal line can be charged up rapidly and hence the propagation delay of the signal is cut down largely.

As can be seen from FIGS. 3, 6 and 8, in order to accomplish the purpose of the present invention, the low- and high-level voltages, $V_L$ and $V_H$, must be selected to satisfy the condition with respect to the threshold voltage $V_{TH}$ to be $V_L<V_{TH}<V_H$, and more specifically, if many gates are connected to the signal line, the above-mentioned condition must be satisfied with respect to all of the threshold voltages, $V_{TH1}$, $V_{TH2}$ ..., $V_{THn}$, of all those gates connected to the signal line, to be $V_L<(V_{TH1}, V_{TH2} ..., V_{THn})<V_H$.

The effect of the present invention can be exhibited largely, when it is applied to a signal line having a lot of gates on either input and output ends as in a bus line in a microcomputer. That is, for driving a bus line having a large capacitive load, it is necessary to make the transconductance $g_m$ of output transistors of all those gates large, namely it is necessary to make the transistor size large, resulting in an increase of the area. Ordinarily the number of these gates is large, then as a whole they take a considerable area. This hinders the degree of integration of the circuit and brings about the increase of the power consumption. In contrast with the method stated above, in accordance with the present invention, only the addition of one unit of the circuit of the present invention to the signal line can improve the signal propagation delay, then the increase of the circuit area can be kept minimum.

Hereupon, when the present invention is used in an integrated circuit, in case that the signal line is made of a material having a very low resistivity such as aluminum, the wiring resistance between a transmitting point and a receiving point can be neglected and therefore the voltage waveform on the signal line does not depend upon the position on the line. In this case the digital signal transmission booster of the present invention can be installed anywhere on the line and the same result independent from the installation position can be obtained. On the other hand, in case that the signal line is made of a material having a relatively high resistivity such as polycrystalline silicon, the wiring resistance between a transmitting point and a receiving point becomes a large value (reaches up to 50 k$\Omega$), then the voltage waveforms at the transmitting point of the signal line and those at the receiving point are different to each other. In this case, the time constants of the rising up and falling down curves of the voltage waveform at the receiving point is larger than that at the transmitting point, therefore, by installing the digital signal transmitting booster circuit near the transmitting point, the maximum effect of the present invention can be exhibited.

As has been elucidated, in accordance with the present invention, for the case of requiring the high speed digital signal propagation on the signal line despite its large load capacitance, as in the bus line in an integrated microcomputer, the signal propagation delay on it can be reduced largely and moreover it can be realized with a very simple circuit construction, in particular it is very useful when it is applied to digital integrated circuits.

What is claimed is:

1. A digital signal transmission circuit comprising:
   a detection means for receiving voltages of a signal line for transmitting digital voltage signals and detecting whether an instantaneous signal line voltage is in a specified voltage range which is between a predetermined first voltage and a predetermined second voltage, said second predetermined voltage being higher than said first predetermined voltage, lower than said predetermined first voltage, or higher than said predetermined second voltage, and
   a current injection means which injects current into said signal line under control of the output of said detection means, in a manner that said current injection means injects currents into said signal line when said signal voltage on said signal line is in said specified voltage range, said current being injected after said signal voltage is detected to be within said specified voltage range and the signal voltage has increased from a voltage lower than said first predetermined voltage.

2. A digital signal transmission circuit in accordance with claim 1, wherein said current injection means comprises a p-channel MOS field effect transistor.

3. A digital signal transmission circuit comprising:

a detection means for receiving voltages of a signal line transmitting digital voltage signals and detecting whether an instantaneous signal line voltage is in a specified voltage range which is between a predetermined first voltage and a predetermined second voltage, said second predetermined voltage being higher than said first predetermined voltage, lower than said first predetermined voltage, or higher than said second predetermined voltage, and a current ejection means which ejects current out of said signal line under the control of the output of said detection means, in a manner that said current ejection means ejects current out of said signal line when said signal voltage on said signal line is in said specified voltage range, said current being ejected after said signal voltage is detected to be within said specified voltage range and the signal voltage has decreased from a voltage higher than said second predetermined voltage.

4. A digital signal transmission circuit in accordance with claim 3, wherein said current ejection means comprises an n-channel MOS field effect transistor.

5. A digital signal transmission circuit comprising:

a detection means for receiving voltages of a signal line for transmitting digital voltage signals and detecting whether an instantaneous signal line voltage is in a specified voltage range which is between a predetermined first voltage and a predetermined second voltage, said second predetermined voltage being higher than said first predetermined voltage, lower than said first predetermined voltage, or higher than said second predetermined voltage, a current injection means which injects current into said signal line under the control of the output of said detection means, in such a manner that in the case where said signal voltage on said signal line increases, to be within said specified voltage range, from a voltage lower than said first predetermined voltage, said current injection means injects current into said signal line only while said signal voltage on said signal line is in said specified voltage range, and a current ejection means which ejects current out of said signal line under the control of the output of said detection means, in such a manner that in the case where said signal voltage on said signal line decreases to be within said specified voltage range, from a higher voltage than said second predetermined voltage, said current ejection means ejects current out of said signal line only while said signal voltage on said signal line is in said specified voltage range.

6. A digital signal transmission circuit in accordance with claim 5, wherein said current injection means is a p-channel MOS field effect transistor and said current ejection means is an n-channel MOS field effect transistor.

7. A digital signal transmission circuit in accordance with any one of claims 1 to 6, further comprising a plurality of logic gates whose inputs are connected to said signal line for transmitting signals to or receiving signals from said signal line, each of said logic gates having threshold voltages between said first and second predetermined voltages.

8. A digital signal transmission circuit in accordance with any one of claims 1 to 6, wherein said detection circuit comprises:

A first detection circuit which detects whether said voltage on said signal line is higher than said first predetermined voltage or not, a second detection circuit which detects whether said voltage on said signal line is lower than said second predetermined voltage or not, and a flip-flop circuit.

9. A digital signal transmission circut in accordance with claim 7, wherein said detection circuit comprises:

a first detection circuit which detects whether said voltage on said signal line is higher than said first predetermined voltage or not, a second detection circuit which detects whether said voltage on said signal line is lower than said second predetermined voltage or not, and a flip-flop circuit.

* * * * *